(12) United States Patent
Lindert

(10) Patent No.: US 9,577,030 B2
(45) Date of Patent: Feb. 21, 2017

(54) SEMICONDUCTOR STRUCTURE HAVING A CAPACITOR AND METAL WIRING INTEGRATED IN A SAME DIELECTRIC LAYER

(71) Applicant: Nick Lindert, Beaverton, OR (US)

(72) Inventor: Nick Lindert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/720,041

(22) Filed: May 22, 2015

(65) Prior Publication Data

US 2015/0255533 A1 Sep. 10, 2015

Related U.S. Application Data

(62) Division of application No. 13/041,170, filed on Mar. 4, 2011, now abandoned.

(51) Int. Cl.
*H01L 49/02* (2006.01)
*H01L 23/522* (2006.01)
(Continued)

(52) U.S. Cl.
CPC .......... *H01L 28/91* (2013.01); *H01L 21/3213* (2013.01); *H01L 21/76877* (2013.01);
(Continued)

(58) Field of Classification Search
CPC ................ H01L 28/91; H01L 21/3213; H01L 21/76877; H01L 23/5223; H01L 27/10894; H01L 28/90
(Continued)

(56) References Cited

U.S. PATENT DOCUMENTS 6,143,601 A 11/2000 Sun
6,159,787 A 12/2000 Aitken et al.
(Continued)

FOREIGN PATENT DOCUMENTS

EP 1020905 7/2000
JP 11-204753 7/1999
(Continued)

OTHER PUBLICATIONS

Notice of Allowance from Japanese Patent Application No. 2013-556611 mailed May 19, 2015, 1 pg.
(Continued)

*Primary Examiner* — Ori Nadav
(74) *Attorney, Agent, or Firm* — Blakely, Sokoloff, Taylor & Zafman LLP

(57) ABSTRACT

Semiconductor structures having capacitors and metal wiring integrated in a same dielectric layer are described. For example, a semiconductor structure includes a plurality of semiconductor devices disposed in or above a substrate. One or more dielectric layers are disposed above the plurality of semiconductor devices. Metal wiring is disposed in each of the dielectric layers. The metal wiring is electrically coupled to one or more of the semiconductor devices. A metal-insulator-metal (MIM) capacitor is disposed in one of the dielectric layers, adjacent to the metal wiring of the at least one of the dielectric layers. The MIM capacitor is electrically coupled to one or more of the semiconductor devices.

6 Claims, 5 Drawing Sheets

(51) Int. Cl.
  *H01L 21/3213* (2006.01)
  *H01L 21/768* (2006.01)
  *H01L 23/532* (2006.01)
  *H01L 27/108* (2006.01)

(52) U.S. Cl.
  CPC .... *H01L 23/5223* (2013.01); *H01L 27/10894* (2013.01); *H01L 28/90* (2013.01); *H01L 23/53295* (2013.01); *H01L 27/10808* (2013.01); *H01L 27/10852* (2013.01); *H01L 2924/0002* (2013.01)

(58) Field of Classification Search
  USPC ....... 438/238, 239, 240, 243, 622, 634, 637; 257/532, 758, 774
  See application file for complete search history.

(56) References Cited

U.S. PATENT DOCUMENTS

| | | |
|---|---|---|
| 6,346,454 B1 | 2/2002 | Sung et al. |
| 6,472,721 B2 | 10/2002 | Ma et al. |
| 6,593,185 B1 | 7/2003 | Tsai et al. |
| 6,624,040 B1 | 9/2003 | Ng et al. |
| 6,710,425 B2 | 3/2004 | Bothra |
| 6,734,060 B2 | 5/2004 | Nakamura et al. |
| 6,744,090 B2 | 6/2004 | Kim |
| 6,762,087 B1 | 7/2004 | Chitipeddi |
| 6,794,694 B2 | 9/2004 | Diodato et al. |
| 7,348,623 B2 | 3/2008 | Akiyama |
| 7,525,143 B2 | 4/2009 | Chae |
| 7,663,861 B2 | 2/2010 | Nishiura |
| 2002/0127792 A1 | 9/2002 | Yoshitomi et al. |
| 2002/0192919 A1 | 12/2002 | Bothra et al. |
| 2003/0006441 A1 | 1/2003 | Nakamura et al. |
| 2003/0098484 A1 | 5/2003 | Kim |
| 2004/0201053 A1 | 10/2004 | Tu et al. |
| 2004/0251549 A1 | 12/2004 | Huang et al. |
| 2005/0024979 A1 | 2/2005 | Kim et al. |
| 2005/0082586 A1 | 4/2005 | Tu et al. |
| 2010/0079924 A1 | 4/2010 | Keating et al. |

FOREIGN PATENT DOCUMENTS

| | | |
|---|---|---|
| JP | 2000208745 | 7/2000 |
| JP | 2003168738 | 6/2003 |
| JP | 2003218228 | 7/2003 |
| JP | 2004023033 | 1/2004 |
| JP | 2004342787 | 12/2004 |
| JP | 2005051247 | 2/2005 |
| JP | 2005064466 | 3/2005 |
| JP | 2005-101647 | 4/2005 |
| JP | 2006-019379 | 1/2006 |
| JP | 2009141237 | 6/2009 |
| JP | 2011014731 | 1/2011 |
| KR | 100532455 | 11/2005 |
| KR | 10-2008-0019915 | 3/2008 |

OTHER PUBLICATIONS

Office Action for Chinese Patent Application No. 201180070565.1, mailed Jul. 1, 2015, 12 pgs.
Office Action for Chinese Patent Application No. 201180070565.1, mailed Feb. 29, 2016, 10 pgs.
Office Action for Korean Patent Application No. 10-2013-7025332, mailed Feb. 26, 2015, 4 pgs.
Office Action for Taiwanese Patent Application No. 100145348, mailed May 10, 2016, 17 pgs.
International Search Report and Written Opinion from PCT/US2011/063413 mailed Jun. 26, 2012, 9 pgs.
International Preliminary Report on Patentability from PCT/US2011/063413 mailed Sep. 19, 2013, 6 pgs.
Non-Final Office Action from U.S. Appl. No. 13/041,170 mailed Nov. 10, 2014, 14 pgs.
Extended European Search Report and Opinion from EP Application No. 11860186 mailed Jul. 18, 2014, 7 pgs.
Office Action for Japanese Patent Application No. 2013-556611, dated May 7, 2014, 3 pgs.
Office Action for Japanese Patent Application No. 2013-556611, dated Dec. 16, 2014, 3 pgs.
Office Action for Korean Patent Application No. 10-213-7025332, mailed Aug. 28, 2014, 4 pgs.
Office Action and Search Report for Taiwanese Patent Application No. 100145348, mailed Aug. 11, 2014, 11 pgs.
Non-Final Office Action from U.S. Appl. No. 13/041,170 mailed Nov. 6, 2012, 13 pgs.
Final Office Action from U.S. Appl. No. 13/041,170 mailed Feb. 21, 2013, 13 pgs.
Non-Final Office Action from U.S. Appl. No. 13/041,170 mailed Jul. 31, 2013, 24 pgs.
Final Office Action from U.S. Appl. No. 13/041,170 mailed Nov. 12, 2013, 16 pgs.
Final Office Action from U.S. Appl. No. 13/041,170 mailed Feb. 26, 2015, 16 pgs.
Office Action for Taiwanese Patent Application No. 100145348, mailed Feb. 17, 2015, 5 pgs.
Office Action for Chinese Patent Application No. 201180070565.1, mailed Jul. 22, 2016, 8 pgs.
Office Action for Japanese Patent Application No. 2015-127667, mailed Aug. 9, 2016, 2 pgs.
Office Action for Taiwan Patent Application No. 100145348, mailed Aug. 30, 2016, 7 pgs.

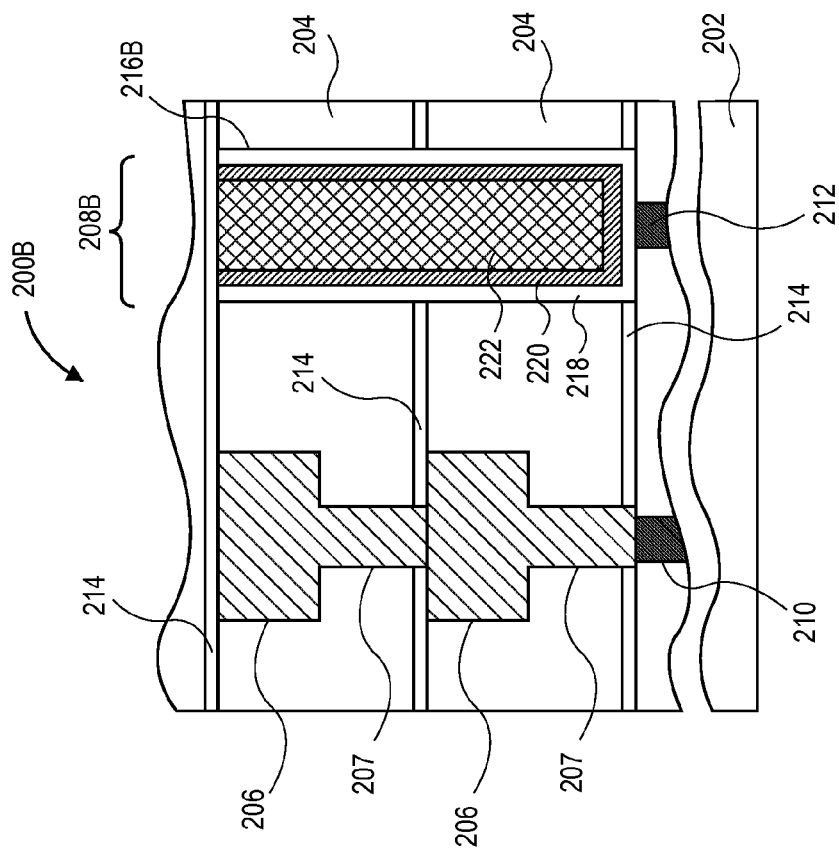
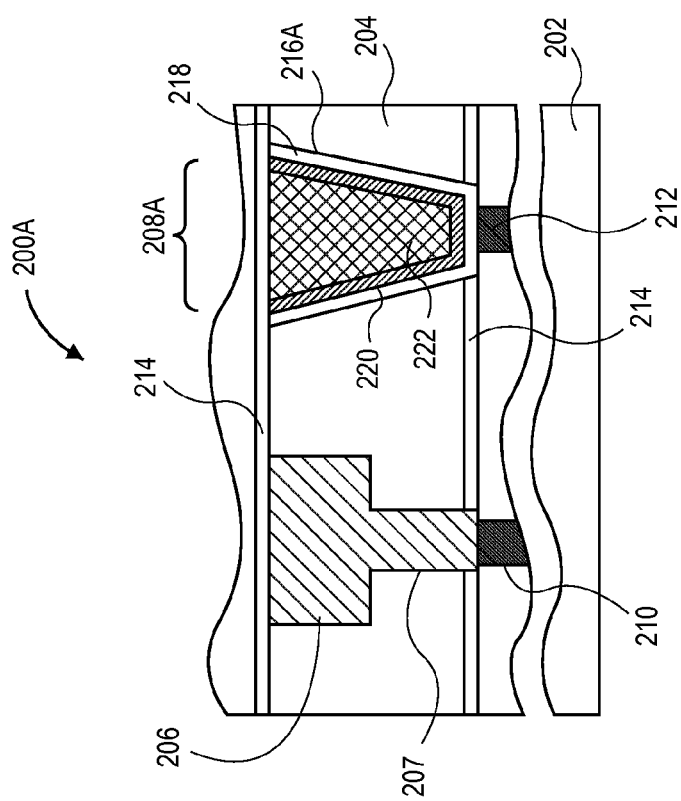

SEMICONDUCTOR STRUCTURE HAVING A CAPACITOR AND METAL WIRING INTEGRATED IN A SAME DIELECTRIC LAYER

CROSS-REFERENCE TO RELATED APPLICATIONS

This application is a divisional of U.S. patent application Ser. No. 13/041,170, filed on Mar. 4, 2011, the entire contents of which are hereby incorporated by reference herein.

TECHNICAL FIELD

Embodiments of the invention are in the field of dynamic random access memory and, in particular, semiconductor structures having capacitors and metal wiring integrated in a same dielectric layer.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In semiconductor devices such as DRAMs (Dynamic Random Access Memory), each cell is composed of one transistor and one capacitor. In DRAMs, cells require periodic reading and refreshing. Owing to the advantages of low price-per-unit-bit, high integration, and ability to simultaneously perform read and write operations, DRAMs have enjoyed widespread use in commercial applications. In the meantime, a phenomenon referred to as "soft error" can be caused in DRAM devices by a loss of charge that was stored in a capacitor due to external factors, thereby causing malfunction of DRAMs. In order to prevent the occurrence of soft error, a method of enhancing the capacitance of a capacitor has been suggested. However, challenges are presented in formulating practical manufacturing processes due to the ever increasing high level of integration of semiconductor devices.

Furthermore, metal lines are typically integrated in layers separate from capacitor layers. In an example, a copper metal layer is formed above a group of capacitors and is not run in the same layer as the capacitors. FIG. 1 represents such an example where vias of metal lines are formed through capacitor dielectric layers to connect the upper metal line layers to lower device layers. Specifically, FIG. 1 is a cross-sectional view of a capacitor formed in a dielectric layer distinct from a dielectric layer used to house metal wiring, in accordance with the prior art.

Referring to FIG. 1, a first interlayer insulating layer 103 is formed on a semiconductor substrate 101 having a cell array region 102. The first interlayer insulating layer 103 is patterned to form contact holes exposing the semiconductor substrate 101 on the cell array region 102 and the contact holes are filled with a conductive material to form a lower electrode contact plug 105A. An etch stop layer 107 and a second interlayer insulating layer 109 are sequentially formed on the resulting structure.

The second interlayer insulating layer 109 and the etch stop layer 107 are sequentially etched in the cell array region 102 to form the lower electrode contact plug 105A and a storage node hole 111 exposing the first interlayer insulating layer 103 around the lower electrode contact plug. After a material layer for a lower electrode is conformally stacked on the resulting structure, a planarization process is carried out to form the lower electrode 113 covering a bottom and an inner sidewall of the storage node hole 111. A dielectric layer 115 and an upper electrode layer 117 are sequentially stacked and patterned on the semiconductor substrate 101. A via 124 of a metal line 122 is formed through capacitor dielectric layers (e.g., dielectric layer 109, and even interlayer dielectric layer 120) to connect the upper metal line 122 layer to the semiconductor substrate 101 having the cell array region 102.

BRIEF DESCRIPTION OF THE DRAWINGS

FIG. 2A illustrates a cross-sectional view of a capacitor formed in a single dielectric layer housing metal wiring, in accordance with an embodiment of the present invention.

FIG. 2B illustrates a cross-sectional view of a capacitor formed in two dielectric layers, each dielectric layer housing metal wiring, in accordance with an embodiment of the present invention.

DETAILED DESCRIPTION

Figure 1:
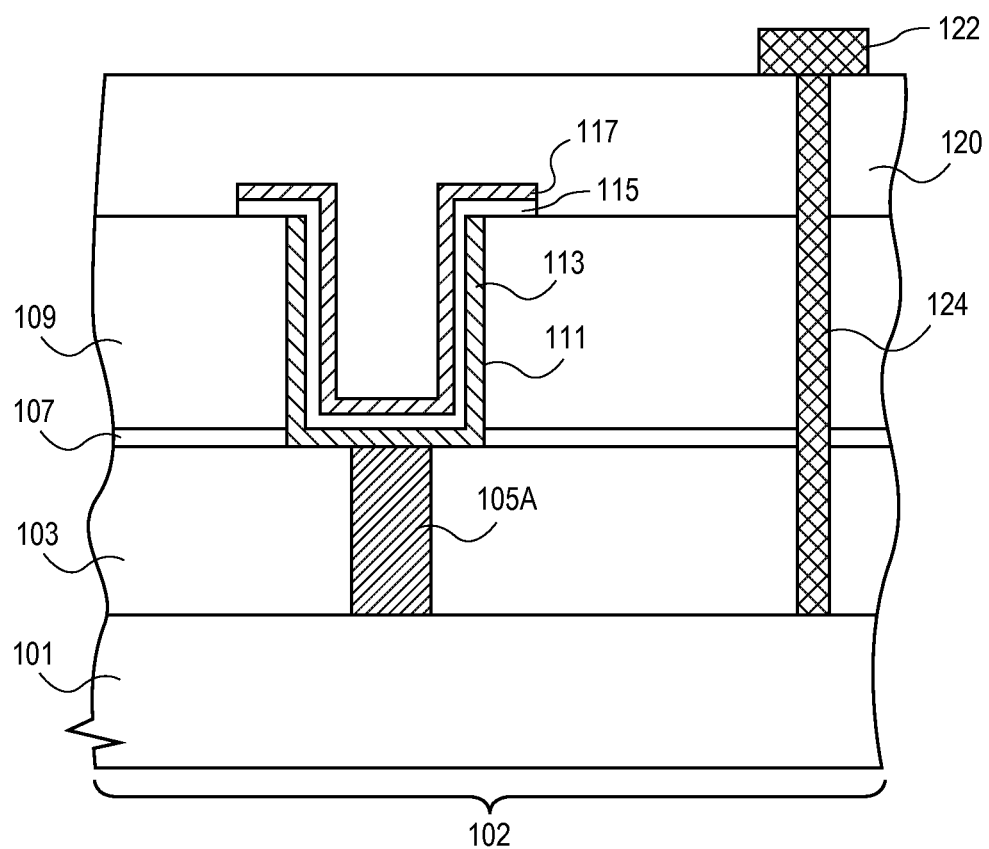
FIG. 1 is a cross-sectional view of a capacitor formed in a dielectric layer distinct from a dielectric layer used to house metal wiring, in accordance with the prior art.

Semiconductor structures having capacitors and metal wiring integrated in a same dielectric layer are described. In the following description, numerous specific details are set forth, such as specific metal wiring layer counts and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Conventional approaches to incorporating capacitor structures with metal wiring layers only introduces metal wirings, such as copper lines, after and above the capacitor layers. In such arrangements, the metal wiring layers do not share dielectric layers with the dielectric layers used to house the capacitor structures. Furthermore, in the conventional architectures, methods are available for increasing the height of the lower electrode as a method for increasing the surface area of the lower electrode to increase capacitance. In one such method, the thickness of a dielectric layer where the lower electrode is positioned is increased. However, if the thickness is increased, the process burden is also increases because large amount of etching is required when the metal contact hole is formed. Furthermore, since the metal wiring is not housed in the dielectric layer, such an approach creates an even greater distance between metal wiring layers and respective device layers.

In accordance with an embodiment of the present invention, a capacitor structure, e.g., for an embedded dynamic random access memory (DRAM) product, is incorporated with metal wiring layers to share one or more dielectric layers housing the metal wiring layers. For example, in one embodiment, the height of the capacitor structure is essentially the height of two metal wiring dielectric layers, and the capacitor structure is formed adjacent to the two metal wiring layers. In another embodiment, the height of the capacitor structure is essentially the height of only one metal wiring dielectric layer, and the capacitor structure is formed adjacent to the one metal wiring layer. However, the capacitor height may need to be the height of 2 or more dielectric layers in order to supply enough capacitance. The capacitor structure may be formed in the metal wiring dielectric layer(s) after formatting of the metal wiring layers. Such an approach allows embedding of a DRAM capacitor into a logic (CPU) process. By contrast, conventional approaches start with a DRAM process and add logic capability later to fabricate embedded DRAM.

The embedded DRAM described herein may be included on a first chip and packaged with a microprocessor on a second chip. Alternatively, the embedded DRAM described herein may be included on the same chip as a microprocessor to provide a monolithic fabrication process.

Disclosed herein are semiconductor structures having capacitors and metal wiring integrated in a same dielectric layer. In one embodiment, a semiconductor structure includes a plurality of semiconductor devices disposed in or above a substrate. One or more dielectric layers are disposed above the plurality of semiconductor devices. Metal wiring is disposed in each of the dielectric layers. The metal wiring is electrically coupled to one or more of the semiconductor devices. A metal-insulator-metal (MIM) capacitor is disposed in one of the dielectric layers, adjacent to the metal wiring of the at least one of the dielectric layers. The MIM capacitor is electrically coupled to one or more of the semiconductor devices.

Also disclosed herein are methods of fabricating semiconductor structures having capacitors and metal wiring integrated in a same dielectric layer. In one embodiment, a method includes forming a plurality of semiconductor devices in or above a substrate. One or more dielectric layers are formed above the plurality of semiconductor devices. Metal wiring is formed in each of the dielectric layers. Forming the metal wiring includes electrically coupling the metal wiring to one or more of the semiconductor devices. A metal-insulator-metal (MIM) capacitor is formed in one of the dielectric layers adjacent to the metal wiring of the at least one of the dielectric layers. Forming the MIM capacitor includes electrically coupling the MIM capacitor to one or more of the semiconductor devices.

In an aspect of the present invention, an embedded metal-insulator-metal (MIM) capacitor is included in the same dielectric layer as metal wiring. For example, FIG. 2A illustrates a cross-sectional view of a capacitor formed in a single dielectric layer housing metal wiring, in accordance with an embodiment of the present invention. In another example, FIG. 2B illustrates a cross-sectional view of a capacitor formed in two dielectric layers, each dielectric layer housing metal wiring, in accordance with an embodiment of the present invention.

Referring to FIGS. 2A and 2B, a semiconductor structure 200A or 200B, respectively, includes a plurality of semiconductor devices disposed in or above a substrate 202. One or more dielectric layers 204 is/are disposed above the plurality of semiconductor devices in or above the substrate 202. Metal wiring 206, such as copper metal wiring, is disposed in each of the dielectric layers 204. Metal wiring 206 is electrically coupled to one or more of the semiconductor devices in or above the substrate 202. A metal-insulator-metal (MIM) capacitor 208A or 208B, respectively, is disposed in at least one of the dielectric layers 204. The MIM capacitor 208A or 208B is adjacent to the metal wiring 206 of the at least one of the dielectric layers 204 and is electrically coupled to one or more of the semiconductor devices in or above the substrate 202.

It is to be understood that metal wiring 206 refers to metal lines, e.g., used as interconnect lines. Metal wiring 206 is to be distinguished from vias, e.g., vias 207, which may also be housed in dielectric layer(s) 204 and used to couple metal wirings 206 in different dielectric layers 204 or to couple a metal wiring with some other electrical contact, e.g., contacts 210. Contact 210 may represent another via, another metal wiring, or an actual contact structure formed between a via 207 and a semiconductor device. MIM capacitor 208A or 208B may be electrically coupled to one or more of the semiconductor devices in or above the substrate 202 through with some electrical contact, e.g., contacts 212. Contact 212 may represent another via, another metal wiring, or an actual contact structure formed between the bottom of MIM capacitor 208A or 208B and a semiconductor device. In an embodiment, at least a portion of the metal wiring 206 is electrically coupled to one or more semiconductor devices included in a logic circuit, and the MIM capacitor 208A or 208B is an embedded dynamic random access memory (eDRAM) capacitor. The top electrode of the MIM capacitor may be connected by a via from an interconnect or metal wiring layer above the MIM capacitor. In one embodiment, such a connection provides the common or ground connection of the eDRAM.

Referring to FIG. 2A, in one embodiment, the MIM capacitor 208A is disposed in only one of the dielectric layers 204. Referring to FIG. 2B, the MIM capacitor 208B is disposed in only two of the dielectric layers 204. In that embodiment, the MIM capacitor 208B is adjacent to the metal wiring 206 of each of the two dielectric layers 204 and also adjacent to a via 207 coupling the metal wiring 206 of each of the two dielectric layers 204. In other embodiments, a MIM capacitor is disposed in more than two of dielectric layers and is adjacent to the metal wiring of all of the more than two dielectric layers.

Referring again to FIGS. 2A and 2B, semiconductor structures 200A and 200B, respectively, further include one or more etch-stop layers 214, such as a silicon nitride, silicon oxide, or silicon oxy-nitride etch-stop layer. For example, an etch-stop layer may be disposed between each of the dielectric layers 204, and directly below the dielectric layer closest to the substrate 202, as depicted in FIGS. 2A and 2B. In an embodiment, the MIM capacitor 208A or 208B is disposed in a trench 216A or 216B, respectively, disposed in the at least one of the dielectric layers 204. The MIM capacitor includes a cup-shaped metal plate 218 disposed along the bottom and sidewalls of the trench 216A or 216B. A second dielectric layer 220 is disposed on and conformal with the cup-shaped metal plate 218. A trench-fill metal plate 222 is disposed on the second dielectric layer 220. The second dielectric layer 220 isolates the trench-fill metal plate 222 from the cup-shaped metal plate 218.

In an embodiment, the trench-fill metal plate 222 is composed mostly of copper. In an embodiment, the cup-shaped metal plate 218 is composed of a copper layer proximate to the bottom of the trench 216A or 216B and distal from the second dielectric layer 220, and is further composed of a metal nitride layer proximate to the second dielectric layer 220 and distal from the bottom of the trench 216A or 216B. In one embodiment, the metal nitride layer is a tantalum nitride layer or a titanium nitride layer. In an embodiment, one or more of the copper layer or the metal nitride layer of the cup-shaped metal plate 218 or the copper of the trench-fill metal plate 222 is formed by a technique such as, but not limited to, an electro-chemical deposition process, an electro-less deposition process, a chemical vapor deposition process, an atomic layer deposition (ALD) process, or a reflow process. It is to be understood that silver, aluminum, or an alloy of copper, silver or aluminum may be used in place of the above described copper. Also, the cup-shaped metal plate 218 may be a single layer feature formed from copper, silver, aluminum, or an alloy thereof. In an alternative embodiment, trench-fill metal plate 222 includes a multiple layer structure. In an embodiment, the cup-shaped metal plate 218 is electrically coupled to an underlying semiconductor device by a floor metal layer, which may be a contact or additional metal wiring layer.

In an embodiment, the sidewalls of the trench include a vertical or near-vertical profile, e.g., the vertical or near-vertical profile of the trench 216B depicted in FIG. 2B. In another embodiment, the sidewalls of the trench taper outward from the bottom of the at least one of the dielectric layers 204 to the top of the at least one of the dielectric layers 204, e.g., the tapered profile of the trench 216A depicted in FIG. 2A. In contrast to the two embodiments shown, other embodiments include a vertical profile for a trench formed in a single dielectric layer 204 or a tapered profiled for a trench formed in two or more dielectric layers 204.

In an embodiment, the at least one of the dielectric layers 204 is a low-K dielectric layer (a layer with a dielectric constant less than 4 for silicon dioxide). In one embodiment, the at least one of the dielectric layers 204 is formed by a process such as, but not limited to, a spin-on process, a chemical vapor deposition process, or a polymer-based chemical vapor deposition process. In a specific embodiment, the at least one of the dielectric layers 204 is formed by a chemical vapor deposition process involving silane or an organo-silane as a precursor gas. In an embodiment, the at least one of the dielectric layers 204 is composed of a material that does not significantly contribute to leakage current between a series of metal interconnects subsequently formed in or on the at least one of the dielectric layers 204. In one embodiment, the at least one of the dielectric layers 204 is composed of a material in the range of 2.5 to less than 4. In a particular embodiment, the at least one of the dielectric layers 204 is composed of a material such as, but not limited to, a silicate or a carbon-doped oxide with 0-10% porosity. In another embodiment, however, the at least one of the dielectric layers 204 is composed of silicon dioxide.

In an embodiment, the second dielectric layer 220 is composed a high-K dielectric layer (a layer with a dielectric constant greater than 4 for silicon dioxide). In one embodiment, the second dielectric layer 220 is formed by an atomic vapor deposition process or a chemical vapor deposition process and is composed of a material such as, but not limited to, silicon oxy-nitride, hafnium oxide, zirconium oxide, hafnium silicate, hafnium oxy-nitride, titanium oxide, or lanthanum oxide. In another embodiment, however, the second dielectric layer 220 is composed of silicon dioxide.

In an embodiment, substrate 202 is composed of a material suitable for semiconductor device fabrication. In one embodiment, substrate 202 is a bulk substrate composed of a single crystal of a material which may include, but is not limited to, silicon, germanium, silicon-germanium or a III-V compound semiconductor material. In another embodiment, substrate 202 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 202 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 202 may further include dopant impurity atoms.

In accordance with an embodiment of the present invention, substrate 202 has thereon or therein an array of complimentary metal-oxide-semiconductor (CMOS) transistors fabricated in a silicon substrate and encased in a dielectric layer. A plurality of metal interconnects may be formed above the transistors, and on a surrounding dielectric layer, and are used to electrically connect the transistors to form an integrated circuit. In one embodiment, the integrated circuit is used for a DRAM.

In another aspect of the present invention, an embedded metal-insulator-metal (MIM) capacitor, such as a capacitor described above, is included in the dielectric layer of a fourth metal wiring. For example, FIG. 3 illustrates a cross-sectional view of a capacitor formed in a single dielectric layer housing fourth-level metal wiring, in accordance with an embodiment of the present invention.

Figure 3:
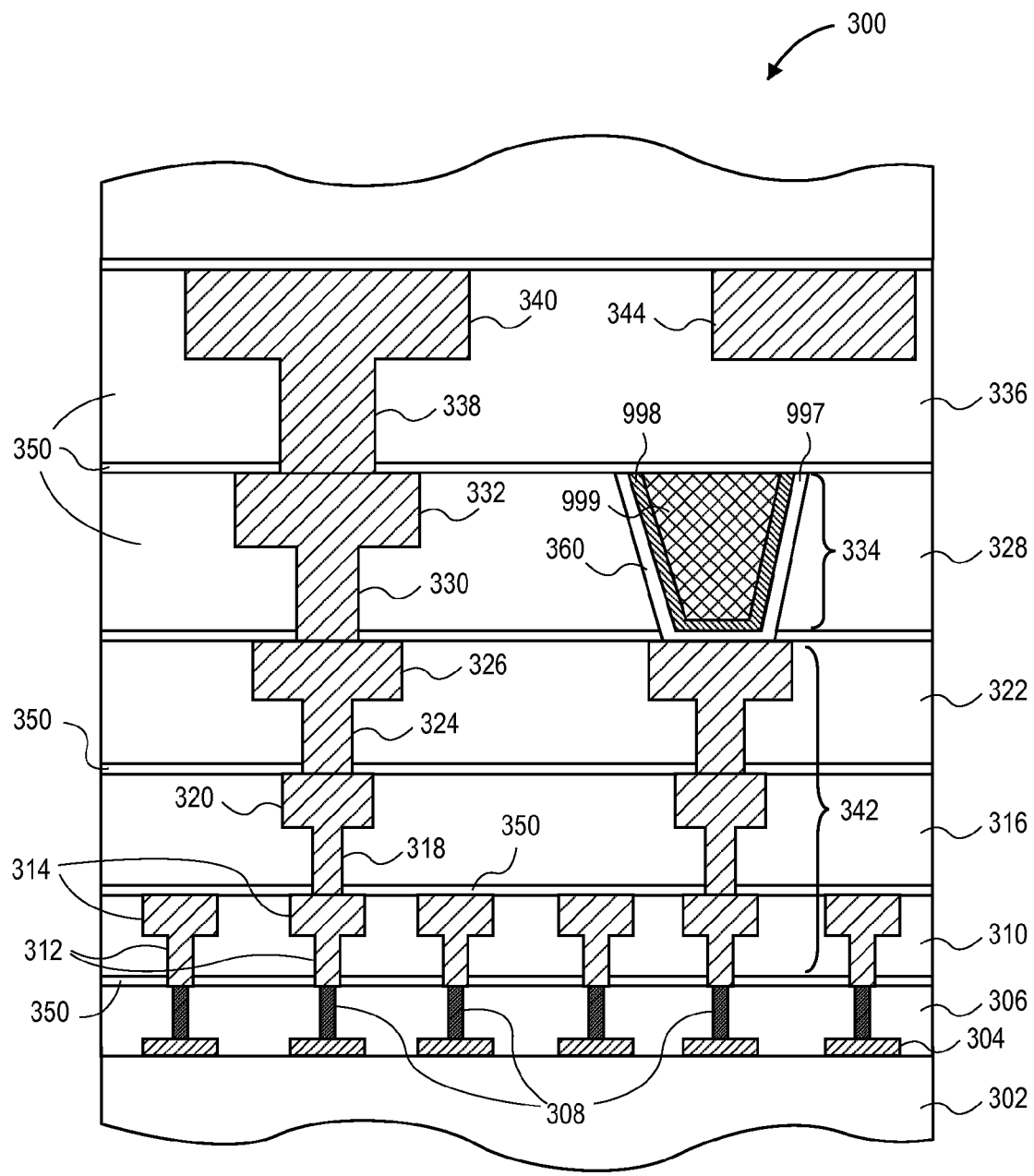
FIG. 3 illustrates a cross-sectional view of a capacitor formed in a single dielectric layer housing fourth-level metal wiring, in accordance with an embodiment of the present invention.

Referring to FIG. 3, a semiconductor structure 300 includes a plurality of semiconductor devices 304 disposed in or above a substrate 302. A first dielectric layer 306 is disposed above the plurality of semiconductor devices 304 and has disposed therein contacts 308 electrically coupled to the plurality of semiconductor devices 304.

A second dielectric layer 310 is disposed above the first dielectric layer 306 and has disposed therein a first metal wiring 314 and one or more vias 312 coupling the first metal wiring 314 to the contacts 308. A third dielectric layer 316 is disposed above the second dielectric layer 310 and has disposed therein a second metal wiring 320 and one or more vias 318 coupling the second metal wiring 320 to the first metal wiring 314. A fourth dielectric layer 322 is disposed above the third dielectric layer 316 and has disposed therein a third metal wiring 326 and one or more vias 324 coupling the third metal wiring 326 to the second metal wiring 320. A fifth dielectric layer 328 is disposed above the fourth dielectric layer 322 and has disposed therein a fourth metal wiring 332 and one or more vias 330 coupling the fourth metal wiring 332 to the third metal wiring 326.

Fifth dielectric layer 328 also has disposed therein at least a portion of a metal-insulator-metal (MIM) capacitor 334. The MIM capacitor 334 is adjacent to the fourth metal wiring 332. The MIM capacitor is electrically coupled to one or more of the semiconductor devices 304, e.g., by a stack 342 of metal wirings and vias and through to a contact 308. A sixth dielectric layer 336 is disposed above the fifth dielectric layer 328 and has disposed therein a fifth metal wiring 340 and one or more vias 338 coupling the fifth metal wiring 340 to the fourth metal wiring 332. In an embodiment, the MIM capacitor 334 is disposed in the fifth dielectric layer 328, but not the fourth or sixth dielectric layers 322 or 336, respectively, as is depicted in FIG. 3. As is also depicted in FIG. 3, a metal wiring 344 may be disposed above the MIM capacitor 334, but need not be coupled with the MIM capacitor 334.

Figure 4:
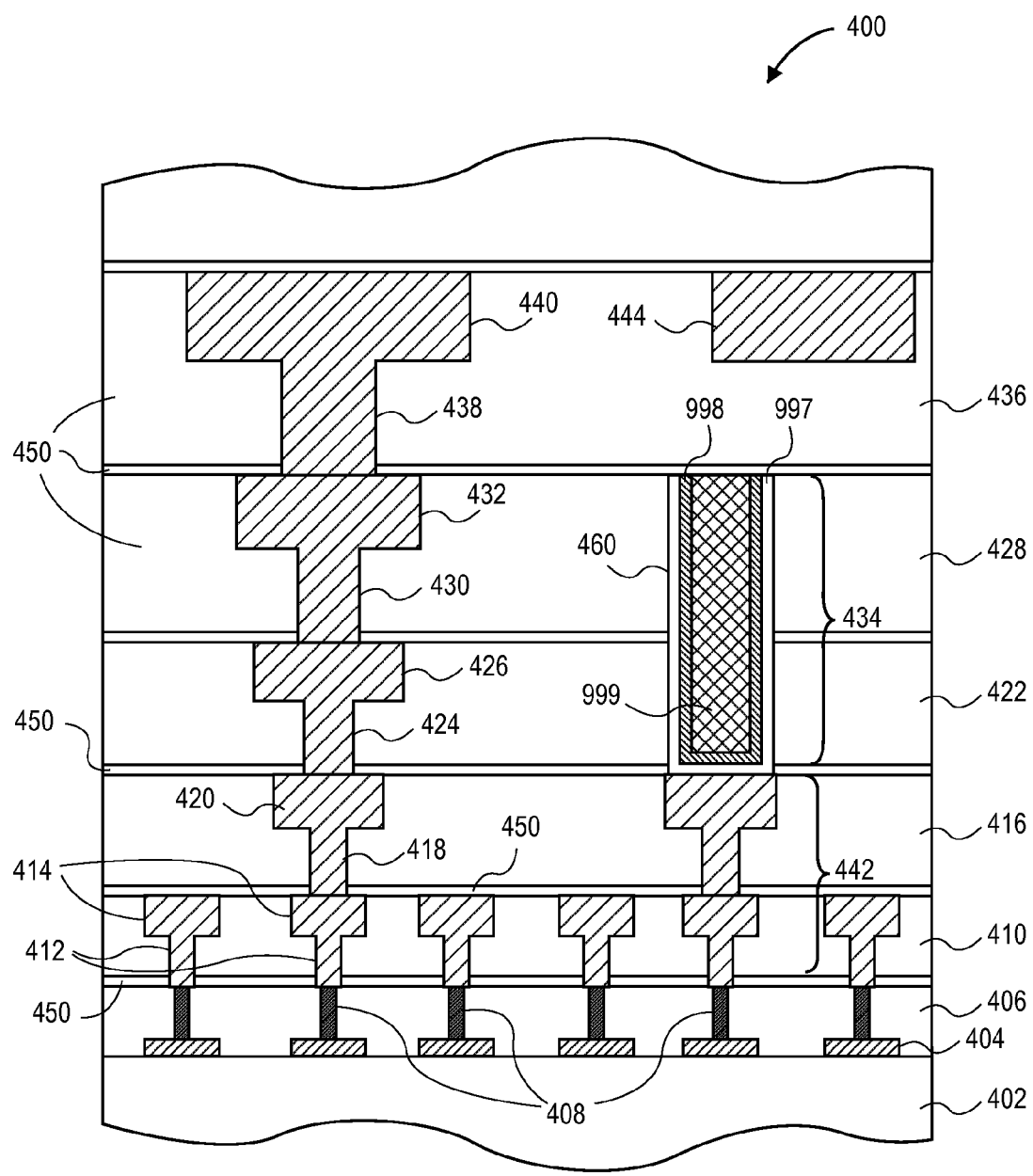
FIG. 4 illustrates a cross-sectional view of a capacitor formed in the two dielectric layers housing third-level and fourth-level metal wiring, in accordance with an embodiment of the present invention.

In another example, FIG. 4 illustrates a cross-sectional view of a capacitor formed in the two dielectric layers housing third-level and fourth-level metal wiring, in accordance with an embodiment of the present invention.

Referring to FIG. 4, a semiconductor structure 400 includes a plurality of semiconductor devices 404 disposed in or above a substrate 402. A first dielectric layer 406 is disposed above the plurality of semiconductor devices 404 and has disposed therein contacts 408 electrically coupled to the plurality of semiconductor devices 404.

A second dielectric layer 410 is disposed above the first dielectric layer 406 and has disposed therein a first metal wiring 414 and one or more vias 412 coupling the first metal wiring 414 to the contacts 408. A third dielectric layer 416 is disposed above the second dielectric layer 410 and has disposed therein a second metal wiring 420 and one or more vias 418 coupling the second metal wiring 420 to the first metal wiring 414. A fourth dielectric layer 422 is disposed above the third dielectric layer 416 and has disposed therein a third metal wiring 426 and one or more vias 424 coupling the third metal wiring 426 to the second metal wiring 420. A fifth dielectric layer 428 is disposed above the fourth dielectric layer 422 and has disposed therein a fourth metal wiring 432 and one or more vias 430 coupling the fourth metal wiring 432 to the third metal wiring 426.

Fifth dielectric layer 428 also has disposed therein at least a portion of a metal-insulator-metal (MIM) capacitor 434. The MIM capacitor 434 is adjacent to the fourth metal wiring 432. The MIM capacitor is electrically coupled to one or more of the semiconductor devices 404, e.g., by a stack 442 of metal wirings and vias and through to a contact 408. A sixth dielectric layer 436 is disposed above the fifth dielectric layer 428 and has disposed therein a fifth metal wiring 440 and one or more vias 438 coupling the fifth metal wiring 440 to the fourth metal wiring 432. In an embodiment, another portion of the MIM capacitor 434 is disposed in the fourth dielectric layer 422, adjacent to the third metal wiring 426, but no portion of the MIM capacitor 434 is disposed in the third or the sixth dielectric layers 416 or 436, respectively, as is depicted in FIG. 4. As is also depicted in FIG. 4, a metal wiring 444 may be disposed above the MIM capacitor 434, but need not be coupled with the MIM capacitor 434.

Referring to both FIGS. 3 and 4, in an embodiment, at least a portion of the fourth metal wiring 332 or 432 is electrically coupled to one or more semiconductor devices 308 or 408 included in a logic circuit, and the MIM capacitor 334 or 434 is an embedded dynamic random access memory (eDRAM) capacitor. In an embodiment, semiconductor structure 300 or 400 further includes a plurality of etch-stop layers 350 or 450, respectively. As shown, an etch-stop layer may be disposed between each of the first (306 or 406), second (310 or 410), third (316 or 416), fourth (322 or 422), fifth (328 or 428) and sixth (336 or 436) dielectric layers.

In an embodiment, the MIM capacitor 334 or 434 is disposed in a trench 360 or 460, respectively, disposed in at least the fifth dielectric layer 328 or 428. In one such embodiment, the MIM capacitor 334 or 434 includes a cup-shaped metal plate 997 disposed along the bottom and sidewalls of the trench 360 or 460. A seventh dielectric layer 998 is disposed on and conformal with the cup-shaped metal plate 997. A trench-fill metal plate 999 is disposed on the seventh dielectric layer 998. The seventh dielectric layer 998 isolates the trench-fill metal plate 999 from the cup-shaped metal plate 997. In a specific embodiment, the sidewalls of the trench have a vertical or near-vertical profile, as is depicted for trench 460 of FIG. 4. In another specific embodiment, the sidewalls of the trench taper outward from the bottom to the top of the fifth dielectric layer 328 or 428, as is depicted for trench 360 of FIG. 3.

In an embodiment, the second (310 or 410), third (316 or 416), fourth (322 or 422), fifth (328 or 428) and sixth (336 or 436) dielectric layers are low-K dielectric layers, and the seventh dielectric layer 998 is a high-K dielectric layer. Other materials or structural details for the features of semiconductor structures 300 and 400 of FIGS. 3 and 4, respectively, may be such as described above for semiconductor structures 200A and 200B.

It is to be understood that, in other embodiments, additional single or multiple layers of dielectric layers and/or metal lines may be formed below or above MIM capacitors 334 or 434. Also, in other embodiments, single or multiple layers of dielectric layers and/or metal lines may be removed from below or above MIM capacitors 334 or 434. In other embodiments, MIM capacitors 334 or 434 are formed in additional one or more layers of dielectric layers. In one exemplary embodiment, in reference to FIG. 4 (although not shown), another portion of the MIM capacitor 434 is disposed in both the fourth 422 and sixth 436 dielectric layers, adjacent to the third 426 and fifth 440 metal wirings. In one such embodiment, however, no portion of the MIM capacitor is disposed in the third dielectric layer 416.

Figure 5:
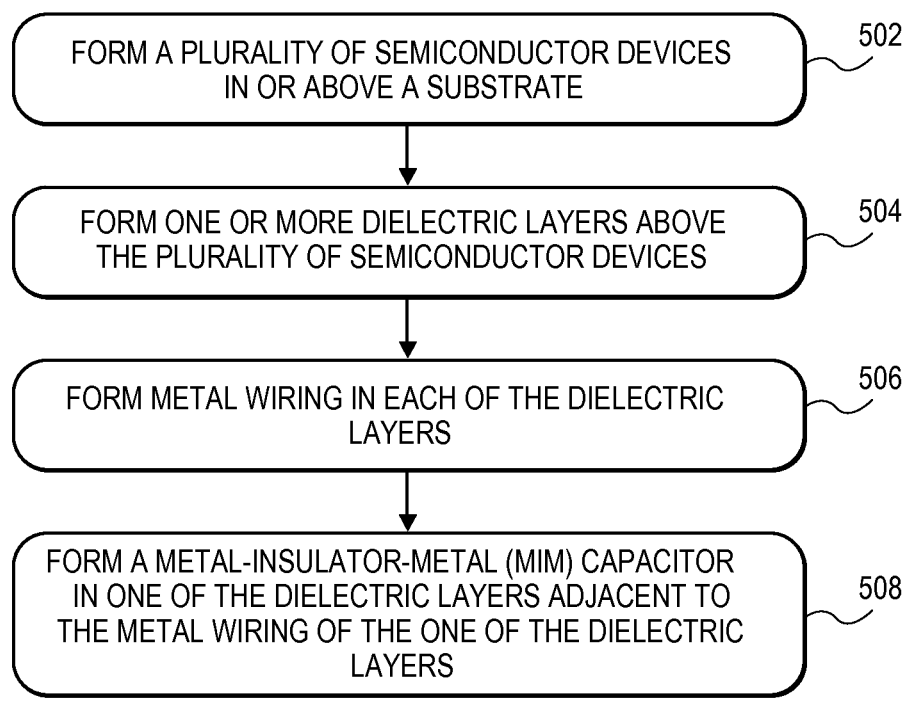
FIG. 5 is a Flowchart representing operations in a method of forming a semiconductor structure having a capacitors and metal wiring integrated in a same dielectric layer, in accordance with an embodiment of the present invention.

In another aspect of the present invention, a method of fabricating an embedded metal-insulator-metal (MIM) capacitor for semiconductor devices is provided. FIG. 5 is a Flowchart 500 representing operations in a method of forming a semiconductor structure having a capacitors and metal wiring integrated in a same dielectric layer, in accordance with an embodiment of the present invention.

Referring to operation 502 of Flowchart 500, a plurality of semiconductor devices is formed in or above a substrate.

Referring to operation 504 of Flowchart 500, one or more dielectric layers is formed above the plurality of semiconductor devices.

Referring to operation 506 of Flowchart 500, metal wiring is formed in each of the dielectric layers. In an embodiment, forming the metal wiring includes electrically coupling the metal wiring to one or more of the semiconductor devices. In one embodiment, electrically coupling the metal wiring to one or more of the semiconductor devices includes coupling to one or more semiconductor devices included in a logic circuit.

Referring to operation 508 of Flowchart 500, a metal-insulator-metal (MIM) capacitor is formed in at least one of the dielectric layers adjacent to the metal wiring of the at least one of the dielectric layers. In an embodiment, forming the MIM capacitor includes electrically coupling the MIM capacitor to one or more of the semiconductor devices. In one embodiment, forming the MIM capacitor includes forming an embedded dynamic random access memory (eDRAM) capacitor.

In accordance with an embodiment of the present invention, forming the MIM capacitor includes forming the MIM capacitor in only one of the dielectric layers. In another embodiment, forming the MIM capacitor includes forming the MIM capacitor in only two of the dielectric layers, adjacent to the metal wiring of each of the two dielectric layers and also adjacent to a via coupling the metal wiring of each of the two dielectric layers. In one such embodiment, the method further includes, subsequent to forming the first of the two of the dielectric layers and prior to forming the second of the two of the dielectric layers and the MIM capacitor, forming an etch-stop layer on the first of the two of the dielectric layers. The etch-stop layer is then patterned to open a region for subsequently forming the MIM capacitor. The second of the two of the dielectric layers is formed on the patterned etch-stop layer and in the region. In yet another embodiment, forming the MIM capacitor includes forming the MIM capacitor in more than two of the dielectric layers, adjacent to the metal wiring of all of the more than two dielectric layers.

In an embodiment, forming the MIM capacitor includes forming a trench in the one of the dielectric layers, forming a cup-shaped metal plate along the bottom and sidewalls of the trench, forming a second dielectric layer on and conformal with the cup-shaped metal plate, and forming a trench-fill metal plate on the second dielectric layer, the second dielectric layer isolating the trench-fill metal plate from the cup-shaped metal plate. In one such embodiment, forming the trench includes forming the sidewalls of the trench to have a vertical or near-vertical profile. In another such embodiment, forming the trench includes forming the sidewalls of the trench to taper outward from the bottom of the at least one of the dielectric layers to the top of the at least one of the dielectric layers. In an embodiment, forming the second dielectric layer includes forming a high-K dielectric layer.

In an embodiment, a method of fabricating a semiconductor structure having a capacitors and metal wiring integrated in a same dielectric layer further includes forming one or more etch-stop layers, including forming an etch-stop layer between each of the dielectric layers, and directly below the dielectric layer closest to the substrate. In an embodiment, forming the one or more dielectric layers includes forming one or more low-K dielectric layers. Other materials or structural details for the features of the fabricated semiconductor structure may be such as described above for semiconductor structures 200A, 200B, 300 and 400.

Thus, semiconductor structures having capacitors and metal wiring integrated in a same dielectric layer have been disclosed. In an embodiment, a semiconductor structure includes a plurality of semiconductor devices disposed in or above a substrate. The semiconductor structure also includes one or more dielectric layers disposed above the plurality of semiconductor devices. The semiconductor structure also includes metal wiring disposed in each of the dielectric layers and electrically coupled to one or more of the semiconductor devices. The semiconductor structure also includes a metal-insulator-metal (MIM) capacitor disposed in one of the dielectric layers, adjacent to the metal wiring of the at least one of the dielectric layers, and electrically coupled to one or more of the semiconductor devices. In one such embodiment, at least a portion of the metal wiring is electrically coupled to one or more semiconductor devices included in a logic circuit, and the MIM capacitor is an embedded dynamic random access memory (eDRAM) capacitor.

What is claimed is:

1. A method of fabricating a semiconductor structure, the method comprising:
    forming a plurality of semiconductor devices in or above a substrate;
    forming a first dielectric layer above the plurality of semiconductor devices;
    forming an etch-stop layer on the first dielectric layer;
    patterning the etch-stop layer to form an open region in the etch-stop layer;
    subsequent to patterning the etch-stop layer, forming a second dielectric layer on the etch-stop layer;
    forming metal wiring in each of the first and second dielectric layers, the forming comprising electrically coupling the metal wiring to one or more of the semiconductor devices; and
    subsequent to forming the second dielectric layer, forming a metal-insulator-metal (MIM) capacitor in the first and second dielectric layers adjacent to the metal wiring, the MIM capacitor formed in the open region formed in the etch-stop layer, the forming comprising electrically coupling the MIM capacitor to one or more of the semiconductor devices.

2. The method of claim 1, wherein electrically coupling the metal wiring to one or more of the semiconductor devices comprises coupling to one or more semiconductor devices included in a logic circuit, and wherein forming the MIM capacitor comprises forming an embedded dynamic random access memory (eDRAM) capacitor.

3. The method of claim 1, wherein forming the MIM capacitor comprises:
    forming a trench in the first and second dielectric layers;
    forming a cup-shaped metal plate along the bottom and sidewalls of the trench;
    forming a second dielectric layer on and conformal with the cup-shaped metal plate; and
    forming a trench-fill metal plate on the second dielectric layer, the second dielectric layer isolating the trench-fill metal plate from the cup-shaped metal plate.

4. The method of claim 3, wherein forming the trench comprises forming the sidewalls of the trench to have a vertical or near-vertical profile.

5. The method of claim 3, wherein forming the trench comprises forming the trench with tapered sidewalls.

6. The method of claim 3, wherein forming the one or more dielectric layers comprises forming one or more low-K dielectric layers, and forming the second dielectric layer comprises forming a high-K dielectric layer.

* * * * *